United States Patent
Akkila

(10) Patent No.: US 7,936,226 B2
(45) Date of Patent: May 3, 2011

(54) CIRCUIT AND METHOD FOR A WIRELESS ACCESSORY OF A MOBLIE DEVICE

(75) Inventor: Jari Akkila, Helsinki (FI)

(73) Assignee: Suunto Oy, Vantaa (FI)

( * ) Notice: Subject to any disclaimer, the term of this patent is extended or adjusted under 35 U.S.C. 154(b) by 137 days.

(21) Appl. No.: 12/338,936

(22) Filed: Dec. 18, 2008

(65) Prior Publication Data
US 2009/0160568 A1    Jun. 25, 2009

(30) Foreign Application Priority Data

Dec. 20, 2007    (FI) .................................... 20075938

(51) Int. Cl.
*H03H 9/02*    (2006.01)
(52) U.S. Cl. .................. 331/107 A; 331/117 R; 331/185
(58) Field of Classification Search .............. 331/117 R, 331/107 A, 185; 455/336
See application file for complete search history.

(56) References Cited

U.S. PATENT DOCUMENTS

| | | | |
|---|---|---|---|
| 5,191,317 A | 3/1993 | Toth et al. | |
| 5,392,771 A | 2/1995 | Mock et al. | |
| 6,904,101 B1 * | 6/2005 | Tang | 375/316 |
| 2003/0206069 A1 | 11/2003 | Hanselmann | |
| 2006/0264196 A1 * | 11/2006 | Fan | 455/336 |
| 2007/0139130 A1 * | 6/2007 | Kim et al. | 331/185 |
| 2007/0273344 A1 | 11/2007 | Nishiyama | |
| 2008/0176529 A1 * | 7/2008 | Lau | 455/336 |

FOREIGN PATENT DOCUMENTS

| | | |
|---|---|---|
| EP | 0311128 B1 | 4/1989 |
| GB | 2 433 365 A | 6/2007 |

* cited by examiner

*Primary Examiner* — Joseph Chang
(74) *Attorney, Agent, or Firm* — Birch, Stewart, Kolasch & Birch, LLP

(57) ABSTRACT

The invention relates to a circuit and method for a wireless accessory of a portable computer. The circuit comprises an oscillator circuit, a control circuit connected to the oscillator circuit, and a quenching circuit connected to the oscillator circuit. According to the invention, the oscillator circuit is formed of an LC resonator, the quality factor of which is at least 10, and the quenching circuit is formed in such a way that the energy of the oscillator circuit is discharged by a predefined current.

13 Claims, 2 Drawing Sheets

CIRCUIT AND METHOD FOR A WIRELESS ACCESSORY OF A MOBLIE DEVICE

The present invention relates to a circuit for a wireless accessory of a mobile device.

The invention also relates to a method relating to the circuit.

FI patent publication 115084 discloses a circuit for telemetric transmission. The publication presents a circuit, with the aid of which the oscillator circuit of a transmitter circuit can be quenched with the aid of a quenching circuit. In the circuit in question, however, a relatively large voltage connected over the diode will remain oscillating, despite the quenching circuit. In addition, the circuit in question quenches the oscillation immediately, except for the aforementioned low-amplitude after oscillation, in which case a high-frequency interference pulse arises in the high-quality oscillator circuit.

U.S. Pat. No. 5,392,771 discloses a solution, in which quenching of an oscillator circuit is used to create information. In this publication too, the drawbacks described above, the interference pulse caused by the rapid quenching and the excess power consumption caused by poor quenching, are not eliminated.

The invention is intended to eliminate the drawbacks of the prior art disclosed above and for this purpose create an entirely new type of apparatus and method for a wireless accessory of a mobile device.

The invention is based on using an oscillator circuit with a high Q value and, in connection with this a quenching circuit, which uses a low quenching current to quench the oscillator circuit in a controlled manner.

The invention is advantageously applied in a wristop computer and its wireless accessory, such as a heart-rate belt, or in some other wireless accessory, such as a shoe transmitter, or a cadence transmitter in a bicycle. The invention can also be used in diving applications, in the pressure transmitter of a pressure tank.

The invention is further preferably implemented in such a way that, after the quenching, the energy of the oscillator circuit is led to the operating voltage, so that the power consumption diminishes.

More specifically, the circuit according to the invention is characterized by an oscillator circuit, a control circuit connected to the oscillator circuit, and a quenching circuit connected to the oscillator circuit, where the oscillator circuit is formed of an LC resonator, the quality factor of which is at least 10, and the quenching circuit is formed in such a way that the energy of the oscillator circuit is discharged by a predefined current.

The method according to the invention is, in turn, characterized by forming an electrical oscillation, the oscillation being started by means of a control command, and quenching the oscillation by means of a separate control command, wherein the oscillation is formed by means of an oscillator circuit that is formed of an LC resonator, the quality factor of which is at least 10, and the oscillation is quenched in such a way that the energy of the oscillator circuit is discharged by a predefined current.

Considerable advantages are gained with the aid of the invention.

Generally, by using an LC resonator with a good Q value, savings in power consumption will, as such, already be achieved. If, in addition to this, a quenching circuit, which feeds the energy being quenched to the operating voltage, of the resonator being slowly quenched is used in connection with a resonator with a good Q value, additional energy savings will be made. If, in addition to this, the interference bursts of a rapid quenching circuit according to the prior art are avoided, the total effect achieved with the invention will be significant. An energy savings of as much as 75% relative to known solutions will be achieved.

Thanks to the energy saving achieved, it is possible, as a multiplier effect, to use considerably less energy to transmit more information wirelessly from an accessory to a mobile terminal device, such as a wristop computer.

As after-oscillations can be practically eliminated with the aid of the invention, both the transmission pulses and their intervals become unequivocal. From this, it follows directly that the time intervals can be shortened, so that the data-transfer speed can also be increased.

In the following, the invention is examined with reference to the accompanying drawings.

Figure 1:
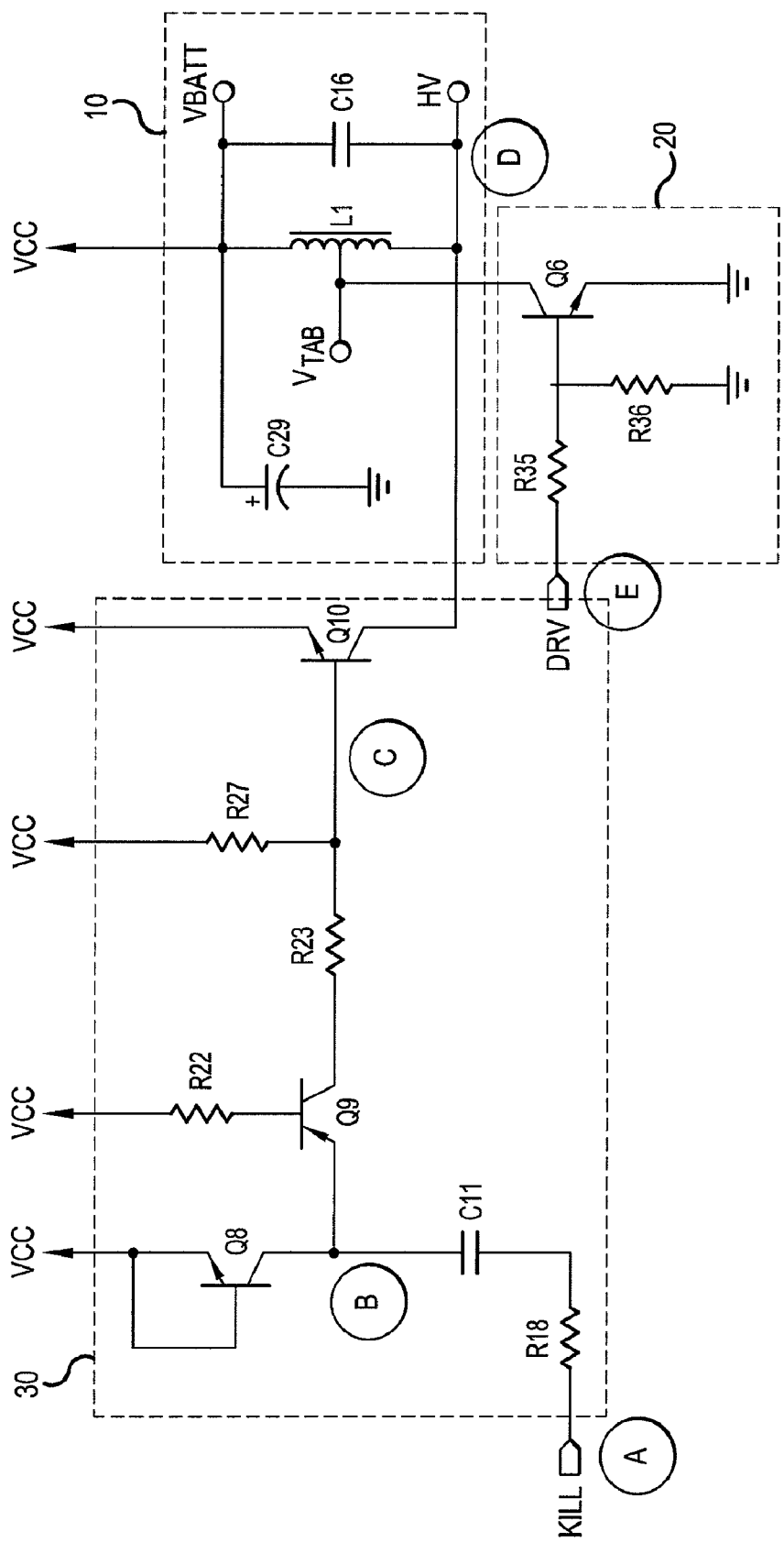
FIG. 1 shows one circuit according to the invention.

According to FIG. 1, the circuit comprises three basic blocks, an oscillator circuit 10, a control circuit of the oscillator circuit 20, as well as a quenching circuit 30.

All the blocks 10, 20, and 30 on the block scheme level are connected to each other and the controller circuit 20 is controlled from the connection E(DRV), by means of which the oscillator circuit (10) is set to the operating state with the aid of the collector of the NPN transistor Q6.

The quenching circuit 30, for its part, receives its control from the connection A (KILL) and by means of this circuit the oscillation of the oscillator circuit 10 is terminated softly with the aid of a control signal brought to the base of the NPN transistor Q10.

The oscillator circuit 10 itself contains coil L1 and a capacitor C16 connected in parallel to it, both of which are selected in such a way that their resistive components are as small as possible. In other words, their Q value is as high as possible. Typically, in the prior art the Q values for the oscillator circuits are in the order of magnitude of 5, whereas in the solution according to the invention a Q value of 10 or greater is sought in the case of the LC resonator. Thus, the bandwidth of the frequency spectrum produced by the resonator diminishes significantly. On the other hand, as the resistive components are very small, the resonator continues to oscillate for a very long time with the aid of the energy fed to it. As a result, a traditional quenching circuit will be unable to quench the oscillation, which instead will be transmitted wirelessly to the environment as radio-frequency power.

In the oscillator circuit 10 according to the invention parallel to the oscillator coil L1 and the capacitor C16 that are connected in parallel, there is, if necessary, further a large capacitor C29, which stabilizes the operating voltage. In one preferred embodiment of the invention, the size of the capacitor C16 is 220 µF and the size of the coil L1 is, in turn, 3.75 mH. The inductance of the coil L1 is 3.75 mH, measured between the points VCC and HV (D).

The controller circuit 20 is formed of an NPN transistor Q 6, the collector of which is connected to the middle connector of the resonator coil L1. The inductance of the gap VCC—middle connector, of the coil L1, in the aforementioned case with an operating voltage of 3 V is about 6% of the inductance of the gap VCC—HV (D). In general, the ratio of the inductances of the coil is determined by the voltage VTAB of the collector of the transistor Q6, which is preferably greater than −0.6 V.

The control voltage DRV for the base of the transistor Q6 is, for its part, connected through the resistor R35. In addition to this, the base of the transistor is connected to ground through the resistor R36. A positive pulse to the point E will cause the oscillator circuit 10 to oscillate. The DRV signal of the controller circuit 20 is a positive pulse sequence.

The quenching circuit 30, for its part, comprises an NPN transistor Q10 acting as a switch, the collector of which is connected to the opposite terminal D for the operating voltage VCC of the capacitor C16 and coil L1 of the resonance circuit 10. The transistor Q10 is controlled by means of the current led to its base C, the magnitude of which is determined by the resistor R23. The resistor R27 is used as a pull-up resistor to the operating voltage. R23 determines the magnitude of the discharge current coming from the resonance circuit 10, the order of magnitude of the resistor being in kilo-Ohms. The order of magnitude of the pull-up resistor R27 is in mega-Ohms. The collector of the PNP transistor Q9 is connected to the other end of the resistor R23. The operating voltage VCC is connected to the base of the transistor Q9 through the mega-Ohm order resistor R22. The transistor Q8 is, for its part, connected to point B of the emitter of the transistor Q9, the collector of Q8 being connected to point B and the emitter in turn to the operating voltage VCC. Because the base of transistor Q8 is connected to the collector, in practice transistor Q8 forms a reverse-conducting diode relative to the operating voltage VCC. The capacitor C11, the order of magnitude of which is in nano-farads, is also connected to point B. The other end of the resistor R18 connected to the other terminal of the capacitor C11 is connected to the control signal A (KILL), by means of a positive pulse of which the transistor Q10 is brought to a conductive state, which in practice discharges the oscillating energy of the oscillator circuit 10 to the operating voltage VCC. As stated above, the magnitude of the current is determined by the resistor R23, which is in the order of kilo-Ohms. Thus, by means of the arrangement according to the invention, a pulse sequence given to the terminal E causes the oscillator circuit 10 to oscillate and, once the oscillation has continued sufficiently, the oscillation is cut off by a positive pulse to point A, whereby the transistor Q10 discharges the oscillation energy and thus partly charges the battery.

According to the invention, for example, the transistor Q8 can be replaced with a diode or a resistor, depending on the resistance of the said resistor, the capacitance of the capacitor C11, and the time between the pulse sequences of the DRV signal.

Figure 2:
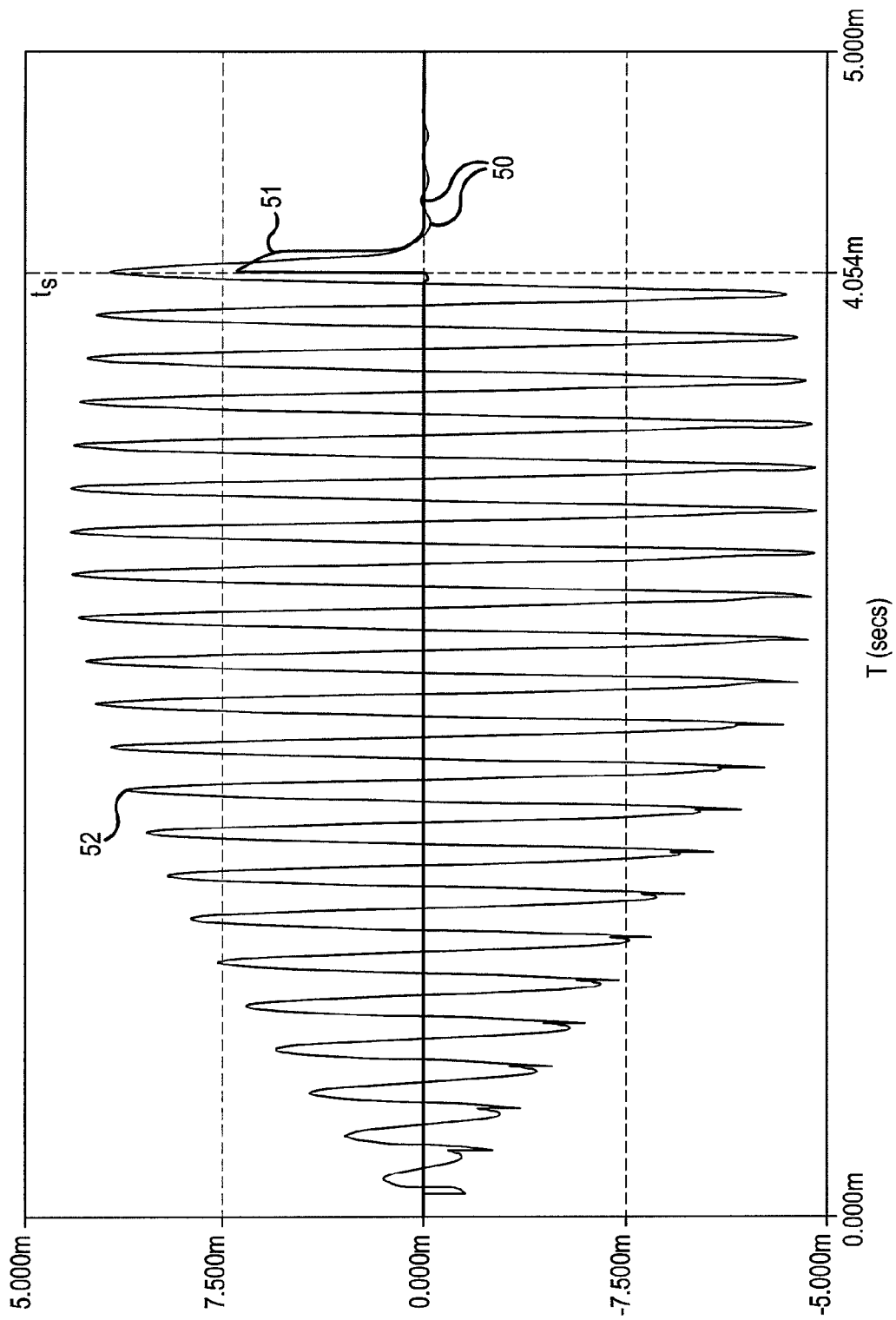
FIG. 2 shows graphically the current of the oscillator circuit according to the invention, as a function of time.

According to FIG. 2, with reference to FIG. 1 the burst-like oscillation current 52 of the oscillator circuit 10 is quenched at moment $t_s$, after which a diminishing oscillation current 50 arises. This current is led to the operating voltage VCC, thus in practice charging the battery acting as the operating voltage. The figure also shows the base current of the transistor Q10 with the reference 51.

In the present application, the term mobile device refers to any portable computer whatever, such as a wristop, palm, or laptop computer.

The invention claimed is:

1. A circuit for a wireless accessory of a portable computer, which circuit comprises
    an oscillator circuit,
    a control circuit connected to the oscillator circuit, and
    a quenching circuit connected to the oscillator circuit,
wherein
    the oscillator circuit is formed of an LC resonator, the quality factor of which is at least 10, and that
    the quenching circuit is formed in such a way that the energy of the oscillator circuit is discharged by a predefined current.

2. The circuit according to claim 1, wherein a transistor (Q10). one terminal of which is connected directly to the other end of the LC circuit, is used as a switching element.

3. The circuit according to claim 1 or 2, wherein an NPN transistor, the emitter of which is connected to the operating voltage (VCC) and the collector to the other terminal (D) of the oscillator circuit, is used as the switching transistor (Q10) of the quenching circuit.

4. The circuit according to claim 1, wherein the quenching circuit comprises means (Q10) for feeding the energy of the quenched oscillator circuit to the operating voltage (VCC).

5. The circuit according to claim 1, wherein the oscillator circuit generates a burst-like oscillation current.

6. The circuit according to claim 1, wherein circuit is implemented as part of a wireless accessory of a portable computer which uses the oscillator circuit to wirelessly transmit information to the portable computer.

7. The circuit according to claim 1, wherein the quenching circuit includes a resistor whose resistance value determines the predefined current magnitude.

8. A method for a wireless accessory of a portable computer, comprising:
    forming an electrical oscillation, the oscillation being started by means of a control command, and
    quenching the oscillation by means of a separate control command,
wherein
    the oscillation is formed by means of an oscillator circuit that is formed of an LC resonator, the quality factor of which is at least 10, and that
    the oscillation is quenched in such a way that the energy of the oscillator circuit is discharged by a predefined current.

9. The method according to claim 8, wherein a transistor (Q10), one terminal of which is connected directly to the other end of the LC circuit, is used as a switching element.

10. The method according to claim 8 or 9, wherein an NPN transistor, the emitter of which is connected to the operating voltage (VCC) and the collector to the other terminal (D) of the oscillator circuit, is used as the switching transistor (Q10) of the quenching circuit.

11. The method according to claim 8, wherein the energy of the quenched oscillator circuit is fed to the operating voltage (VCC).

12. The method according to claim 8, wherein the oscillation is formed by the oscillation circuit with a burst-like oscillation current.

13. The method according to claim 8, wherein the oscillation is used by the wireless accessory as part of a wireless transmission of information to the portable computer.

* * * * *